United States Patent
Sato et al.

(12) 
(10) Patent No.: US 7,347,919 B2
(45) Date of Patent: Mar. 25, 2008

(54) SPUTTER SOURCE, SPUTTERING DEVICE, AND SPUTTERING METHOD

(75) Inventors: Shigemitsu Sato, Kanagawa (JP); Masasuke Matsudai, Kanagawa (JP); Hiroki Oozora, Kanagawa (JP); Junya Kiyota, Kanagawa (JP); Hajime Nakamura, Kanagawa (JP); Satoru Ishibashi, Kanagawa (JP); Atsushi Ota, Kanagawa (JP)

(73) Assignee: ULVAC, Inc., Chigasaki-shi (JP)

( * ) Notice: Subject to any disclaimer, the term of this patent is extended or adjusted under 35 U.S.C. 154(b) by 564 days.

(21) Appl. No.: 10/848,008

(22) Filed: May 19, 2004

(65) Prior Publication Data

US 2004/0231973 A1    Nov. 25, 2004

(30) Foreign Application Priority Data

May 23, 2003    (JP)    .............................. 2003-145921

(51) Int. Cl.
*C23C 14/35*    (2006.01)
(52) U.S. Cl. .............................. 204/192.12; 204/298.2; 204/298.23; 204/298.26; 204/298.14
(58) Field of Classification Search .......... 204/192.12, 204/298.19, 298.2, 298.23, 298.26, 298.14
See application file for complete search history.

(56) References Cited

U.S. PATENT DOCUMENTS 5,399,253 A * 3/1995 Grunenfelder ........... 204/298.2

6,093,293 A    7/2000    Haag et al.
6,284,106 B1    9/2001    Haag et al.

FOREIGN PATENT DOCUMENTS

| JP | 63-171880 | * | 7/1988 |
| JP | 9-125242 | | 5/1997 |
| JP | 11-189873 | | 7/1999 |
| JP | 2000-333439 | * | 4/2000 |

OTHER PUBLICATIONS

Machine Translation of 2000-104167.*

* cited by examiner

*Primary Examiner*—Rodney G. McDonald
(74) *Attorney, Agent, or Firm*—Krantz, Quintos & Hanson, LLP

(57) ABSTRACT

According to the invention, when targets are sputtered, each of them moves with respect to a substrate; and therefore, the entire area of the substrate is opposed to the targets during sputtering, so that a film of homogeneous quality can be formed on the surface of the substrate. During the sputtering, not only the targets but also magnetic field forming devices are moved relative to the targets, and therefore, a large area of the targets can be sputtered. In addition, when the magnetic field forming devices are also moved with respect to the substrate, the region of the target which is highly sputtered, moves with respect to the substrate, so that the thickness distribution of the film formed on the substrate can be even more uniform.

11 Claims, 4 Drawing Sheets

SPUTTER SOURCE, SPUTTERING DEVICE, AND SPUTTERING METHOD

BACKGROUND OF THE INVENTION

1. Field of the Invention

The present invention relates to a magnetron sputtering device.

2. Description of the Related Art

In recent years, as the size of substrates to be provided with a film thereon has been increased, there has been an increasing demand for larger sputter sources. It is however difficult to increase the size of the target, and therefore one suggested sputter source 103 as shown in FIG. 6 has a plurality of small-size targets 115. The targets 115 of the sputter source 103 are arranged flush with each other, and anode electrodes 113 are provided between the targets 115.

The surfaces of the targets 115 are opposed to a substrate to be provided with a film, and magnetic field forming devices 125 are provided at the rear surface side of the targets 115. While a sputter gas is introduced into a vacuum chamber in which the sputter source 103 is placed, and the anode electrodes 113 are at the ground potential, voltage is applied to the targets 115 at a time. Then, magnetic fields formed by the magnetic field forming devices 125 catch electrons in the vicinity of the target surfaces, and thereby the targets 115 are sputtered.

However, the anode electrodes 113 are placed between the targets 115 in the sputter source 103, and the interval between the targets 115 is increased by the space for the anode electrodes 113. Therefore, the film quality of the part of the substrate opposing the gaps between the targets is different from the film quality of the part opposing the targets.

For example, four targets of ITO (Indium Tin Oxide), each having a length of 1380 mm, a width of 230 mm and a thickness of 6 mm, were provided; and anode electrodes were provided between the targets. Then, DC power of 5.7 kW, 4.6 kW, 4.6 kW, and 5.7 kW were applied the targets, respectively, at a film forming temperature of 200° C. and a film forming pressure of 0.67 Pa, while an argon gas was made to flow at a flow rate of 100 sccm and scanning with a magnetic member was carried out seven times. A thin ITO film having a thickness of an estimated 100 nm was formed on the surface of a substrate having a length of 880 mm, a width of 680 mm, and a thickness of 0.7 mm. It was found as a result of examination of the film that, as shown in FIG. 7, the sheet resistance value was high in positions opposing the gaps between the targets; and the distribution of the sheet resistance value was in the range of 25±100/square. In this way, the quality of the film formed using the conventional sputter source is unequal; and it is difficult to form a thin film of uniform quality on a large-size substrate (see U.S. Pat. Nos. 6,284,106 and 6,093,293).

SUMMARY OF THE INVENTION

The present invention is directed to a solution to the above-described disadvantages associated with the conventional technique; and it is an object of the invention to provide a technique of forming a thin film that has a uniform film quality distribution on a large size substrate.

In order to achieve the above-described object, in a sputter source according to the invention, a plurality of targets are sputtered at a time. In the sputter source, a plurality of elongate anode electrodes are disposed on a surface of a target attachment plate, cathode electrodes are each disposed between adjacent anode electrodes and each of the targets is disposed on one of the cathode electrodes. Magnetic field forming device are disposed at the rear surface side of the target attachment plate at an immediate back of the targets, respectively. The anode electrodes and the targets are fixed to the target attachment plate, and the respective magnetic field forming devices and the target attachment plate can move relatively to each other.

A sputtering device according to the invention includes a vacuum chamber, a holder which is disposed in the vacuum chamber and on which an object to be provided with a film is disposed, and a sputter source disposed in a position opposing the holder in the vacuum chamber and having a plurality of targets. The targets are sputtered together. In the sputter source, a plurality of elongate anode electrodes are disposed on the surface of the target attachment plate, and cathode electrodes are each disposed between adjacent anode electrodes. Each of the targets is provided on one of the cathode electrodes. A magnet holding member is disposed at the rear surface side of the target attachment plate, and magnetic field forming devices for forming a magnetic field on the surface of each of the targets are disposed on the magnet holding member at an immediate back of the targets, respectively. The target attachment plate and the magnet holding member are connected to a transfer device. The transfer device moves the targets with respect to the holder respectively in a direction parallel to a plane in which the surfaces of the respective targets are located; and the transfer device moves the magnetic field forming devices relatively to the targets.

In the sputtering device according to the invention, the transfer device moves the magnetic field forming devices relatively to the holder.

In the sputtering device according to the invention, the transfer device moves the magnetic field forming device between the anode electrodes positioned on either side of the target so that the magnetic field forming device is not positioned at an immediate back of the anode electrode when the magnetic field forming device is moved.

In the sputtering device according to the invention, the anode electrodes are provided parallel to each other; and the transfer device reciprocates the respective targets in a direction substantially perpendicular to a lengthwise direction of the anode electrodes.

In the sputtering device according to the invention, the transfer device sets a distance of the targets moving in a direction perpendicular to the lengthwise direction of the anode electrodes to be at least the width of the anode electrode.

A sputtering method using a sputter source according to the invention, the sputter source includes a plurality of elongate anode electrodes provided on approximately flush with each other, cathode electrodes disposed between the anode electrodes, a target disposed on the cathode electrode respectively, and magnetic field forming devices for forming a magnetic field on a surface of the target, disposed at a rear surface side of the targets respectively. The sputtering method includes a steps of; providing an object to be provided with a film in a position opposing to the surfaces of the targets, sputtering the targets, ejecting sputtered-particles from the each of target at a time, and forming a film on the object, wherein each of the targets is moved relatively to the object to be provided with a film while a distance between the plane in which the surfaces of the respective targets are located and the plane in which the surface of the object is located is unchanged, and the magnetic field forming device and each of the target are moved relatively to each other while a distance between the magnetic field forming device and the rear surface of each of the targets is unchanged during the sputtering.

In the sputtering method according to the invention, each of the anode electrodes has an approximately equal width; and the anode electrodes are parallel to each other. A component, perpendicular to a longitudinal direction of the anode electrode in moving distance of the target relative to the object to be provided with a film, is larger than the width of the anode electrode.

In the sputtering method according to the invention, the targets are moved together with the anode electrodes in the same direction.

In the sputtering method according to the invention, the magnetic field forming device and the object to be provided with a film are moved relatively to each other.

In the sputtering method according to the invention, the magnetic field forming device is moved in a range between the anode electrodes in such a manner that the magnetic field forming device is not located at an immediate back of the anode electrode.

According to the invention as descried above, anode electrodes are each provided between adjacent cathode electrodes. Therefore, the cathode electrodes and the anode electrodes are close to each other; and when high negative voltage or AC voltage is applied to the cathode electrodes and the anode electrodes, homogeneous plasma is formed on the surface of a target positioned on each of the cathode electrodes.

When targets made of the same material are provided on the cathode electrodes, and voltage at the same level is applied to the cathode electrodes, the sputter-deposition speed for the targets is equalized.

When a large size substrate is provided opposed to the targets and the targets are moved a distance equal to or more than the width of the anode electrode with respect to the substrate, the substrate is not opposed to the anode electrodes in any locations. In other words, the entire part of the substrate is opposed to the targets. Therefore, a thin film having a homogeneous film thickness distribution and a homogeneous film quality distribution can be formed on the surface of the substrate.

When the width of the anode electrode varies, the moving distance of each of the targets is set to at least the maximum width. If the distance between each of the targets and the anode electrode is too large to ignore, the moving distance of each of the targets may be at least the interval between the targets.

Furthermore, sputtering is carried out as the magnetic field forming devices provided at the rear surface side of the targets are moved relatively to the targets. As a result, a large area of the targets is sputtered and the use efficiency of the targets improves.

Furthermore, when the magnetic field forming device is moved relatively to the target and the substrate to be provided with a film, the magnetic field formed by the magnetic field forming device moves relatively to the substrate. Consequently, the thickness distribution of the thin film formed on the surface of the substrate is even more equalized.

The magnetic field forming devices each move between adjacent anode electrodes so that the devices are not located immediately at the back of the anode electrodes. Therefore, a high magnetic field is not formed on the surfaces of the anode electrodes, and the anode electrodes are not sputtered.

DETAILED DESCRIPTION OF THE PREFERRED EMBODIMENTS

Figure 1:
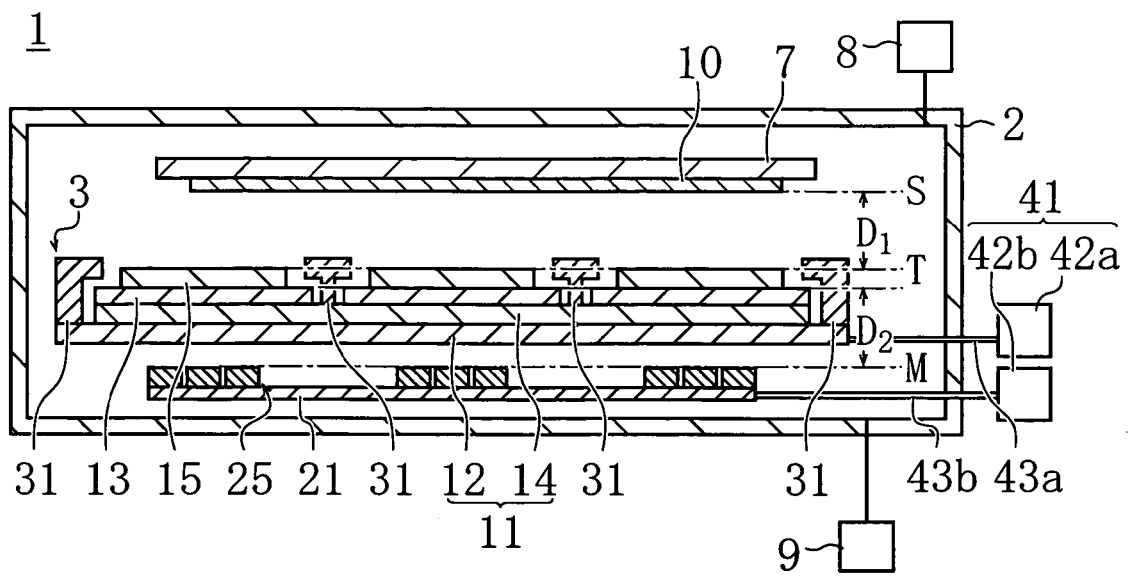
FIG. 1 is a sectional view of a sputtering device according to the present invention.

Now, referring to the drawings, an embodiment of the present invention will be described. The reference numeral 1 in FIG. 1 denotes a sputtering device using a sputter source according to the present invention. The sputtering device 1 includes a vacuum chamber 2, a substrate holder 7 disposed on the side of the inner ceiling of the vacuum chamber 2, and a sputter source 3 disposed in a position below and opposing the substrate holder 7 in the vacuum chamber 2.

Figure 2:
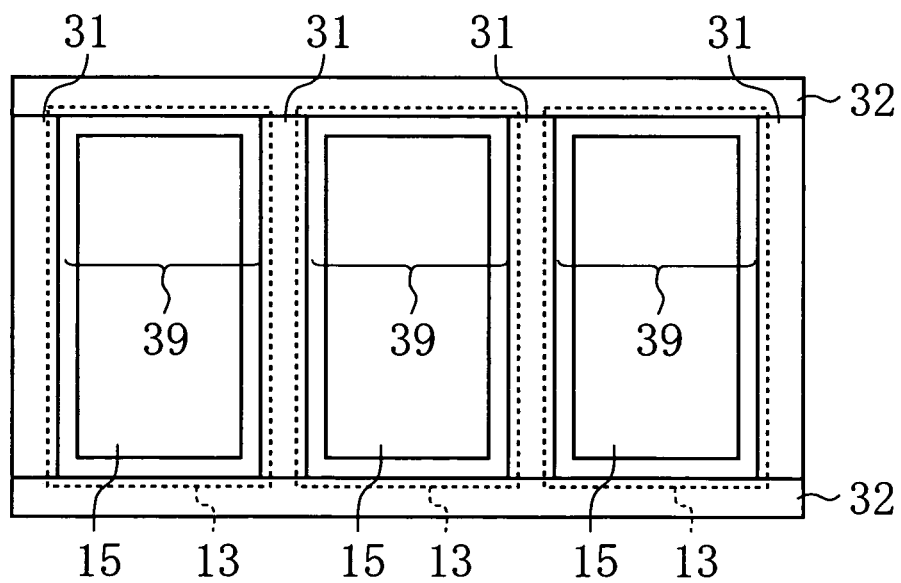
FIG. 2 is a plan view showing the positional relation between anode electrodes and targets.

The sputter source 3 has a target attachment plate 11. A plurality of elongate anode electrodes 31 are provided parallel to and apart from each other on the target attachment plate 11. Elongate connection electrodes 32 are disposed on both ends of the respective anode electrodes 31, as shown in FIG. 2. Each of the anode electrodes 31 and the connection electrodes 32 on both ends thereof are connected to each other, and these electrodes 31 and 32 define openings 39.

A cathode electrode 13 is disposed in each of the openings 39 in such a manner that the cathode electrode 13 does not contact the anode electrode 31 and the connection electrode 32. Therefore, the cathode electrodes 13 are each positioned between adjacent anode electrodes 31.

A target 15 is disposed on each of the cathode electrodes 13, in a similar manner as the cathode electrode 13, that the target 15 does not contact the anode electrode 31 and the connection electrode 32. The target 15 has a smaller size than the opening 39 and is positioned in the center of the opening 39. Therefore, the surface of the target 15 on the opposite side to the cathode electrode 13 is exposed in the opening 39.

The surfaces of the targets 15 are flush with each other, and the substrate as will be described is provided parallel to the surfaces of the targets 15 when the substrate is held by the substrate holder 7. A plate shaped, magnet holding member 21 is disposed approximately parallel to the target attachment plate 11 at the backside of the target attachment plate 11 and on the opposite side to the cathode electrode 13.

A plurality of magnetic field forming devices 25 are provided on the magnet holding member 21 and between the target attachment plate 11 and the magnet holding member 21. Each of the magnetic field forming devices 25 is located at an immediate back of a cathode electrode 13 and a target 15; and as a result, the targets 15 and the magnetic field forming devices 25 are opposed to each other via the target attachment plate 11 and the cathode electrode 13 interposed therebetween.

The magnetic field forming device 25 has a width smaller than those of the cathode electrode 13 and the target 15. The magnetic field forming device 25 is positioned at an immediate back of the target 15 when the magnetic field forming device is in a stationary state. The sputtering device 1 has a transfer device 41 provided outside the vacuum chamber 2. The transfer device 41 has first and second motors 42*a* and 42*b*.

The target attachment plate 11 and the magnet holding member 21 are connected to the first and second motors 42*a* and 42*b* through power transmission members 43*a* and 43*b*, respectively. When the first and second motors 42*a* and 42*b* are operated, their motive power is transmitted to the target attachment plate 11 and the magnet holding member 21 through the power transmission members 43*a* and 43*b*, and the target attachment plate 11 and the magnet holding member 21 move as they keep themselves parallel to each other.

The anode electrodes 31, the cathode electrodes 13, and the targets 15 on the target attachment plate 11 are fixed to the target attachment plate 11 and move together in the same direction when the first motor 42a is operated to move the target attachment plate 11.

The magnetic field forming devices 25 are each made of one or more permanent magnets that are each fixed to the magnet holding member 21, so that when the second motor 42b is operated to move the magnet holding member 21 as described above, the magnetic field forming devices 25 move together in the same direction.

A vacuum exhaustion system 9 and a sputter gas supply system 8 are provided outside the vacuum chamber 2. The vacuum chamber 2 is evacuated/exhausted by the vacuum exhaustion system 9 to form a vacuum atmosphere. A substrate 10 to be provided with a film thereon is introduced into the vacuum chamber 2 and held by the substrate holder 7 while the vacuum atmosphere in the vacuum chamber 2 is maintained. Then, an argon (Ar) gas as a sputter gas is introduced into the vacuum chamber 2 from the sputter gas supply system 8, and a film forming atmosphere at a predetermined pressure is formed.

In the sputtering device 1, the anode electrodes 31 and the vacuum chamber 2 are at a ground potential. When the film forming atmosphere inside the vacuum chamber 2 is maintained and equal negative voltage is applied to each cathode electrodes 13, each surface of the targets 15 is sputtered, and sputtered particles released from the targets 15 reach the surface of the substrate 10.

When the target 15 is sputtered, the substrate 10 is held by the substrate holder 7 in a stationary state and the target attachment plate 11 is moved with respect to the substrate 10 by the transfer device 41.

The reference character S in FIG. 1 denotes a first plane in which the surface of the substrate 10 opposing the sputter source 3 is located, and T denotes a second plane in which the surfaces of the targets 15 are located.

As described above, the substrate 10 is held by the substrate holder 7 parallel to the surfaces of the targets 15. Therefore, the first plane S and the second plane T are parallel to each other.

The target attachment plate 11 is moved by the transfer device 41 so that the surfaces of the targets 15 are moved parallel to the second plane T. The targets 15 are moved together with the target attachment plate 11; and therefore the surface of each of the targets 15 moves inside the second plane T as the plate 11 moves.

As described above, the second plane T is parallel to the first plane S; and therefore, the targets 15 move as their surfaces are kept parallel to the substrate 10. Therefore, the targets 15 are moved while the distance $D_1$ between the first and second planes S and T is unchanged.

When the anode electrode 31 has a width A, and the targets 15 are moved a distance more than the width A in the direction parallel to the substrate 10 and perpendicular to the longitudinal direction of the anode electrode 31, the entire surface of the substrate 10 is opposed to a portion between each of the anode electrodes 31; that is the part excluding the anode electrodes 31.

Herein, the distance between the anode electrode 31 and the target 15 is short enough, and the interval A' between the targets 15 is substantially equal to the width A of the anode electrode 31. Therefore, when the targets 15 are moved a distance equal to or more than the width A of the anode electrode 31, the entire surface of the substrate 10 is opposed to the targets 15.

Figure 3A:
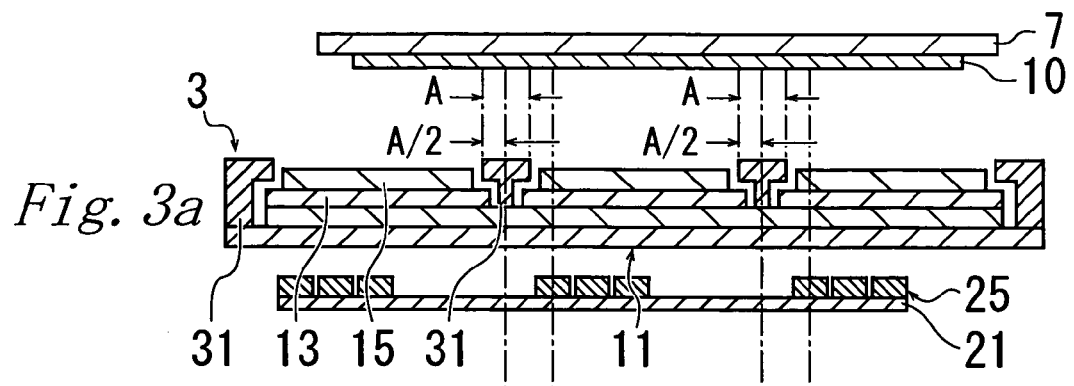
FIGS. 3*a* to 3*c* are sectional views showing the positional relation when targets move with respect to a substrate.
Figure 3B:
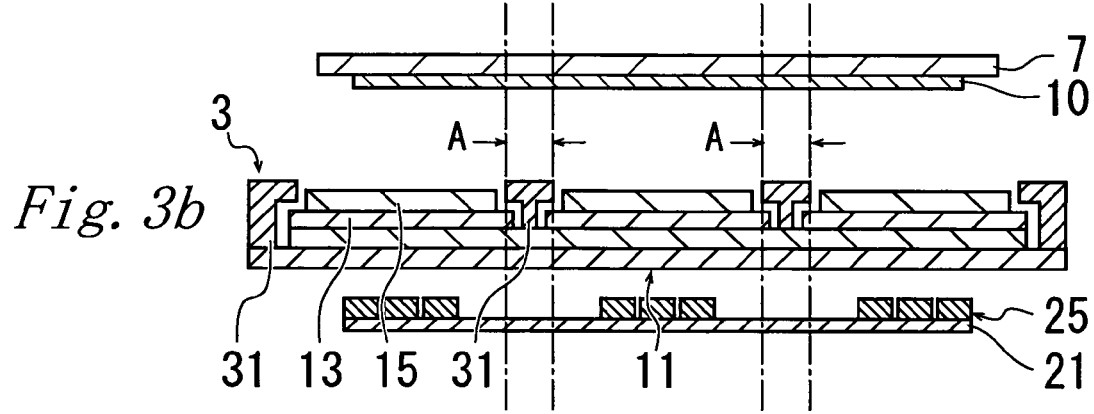
Figure 3C:
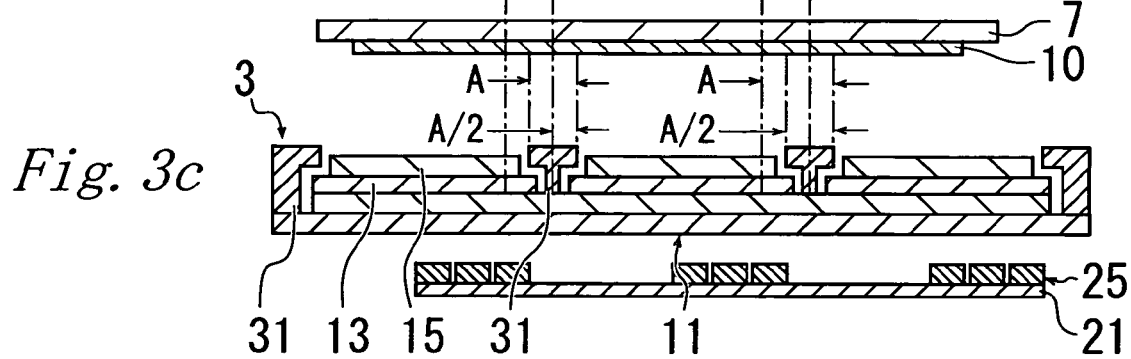

FIGS. 3a to 3c show the states in which the targets 15 are reciprocated. In FIGS. 3a to 3c, during the horizontal reciprocation of the targets 15 in the figure, the targets 15 are moved to the left in FIG. 3a, and to the right in FIG. 3c. FIG. 3b shows the intermediate state between them.

During the reciprocation, the targets 15 are moved both to the left and right with respect to the widthwise direction of the anode electrodes 31. Therefore, when the target 15 is moved so that the moving distance of the target 15 is at least $A/2(+A/2)$ to the left and at least $A/2(-A/2)$ to the right in the widthwise direction from the center of the widthwise direction of the anode electrode as the origin, the moving distance of the target 15 in the widthwise direction of the anode electrode 31 is equal to the width A of the anode electrode 31 or more. Consequently, the entire surface of the substrate 10 is opposed to the target 15.

When the target 15 is moved in a direction not perpendicular to the lengthwise direction of the anode electrode 31, the moving distance is divided into the directions both parallel and perpendicular to the lengthwise direction of the anode electrode 31. When the moving distance of the target 15 in the direction perpendicular to the lengthwise direction of the anode electrode 31 is equal to the width A of the anode electrode 31 or more, even if the target 15 moves circularly or obliquely with respect to the anode electrode 31, the entire surface of the substrate 10 is opposed to the part excluding the anode electrodes 31; that is, a part of the side of sputter source 3 opposed to the substrate 10 excluding the anode electrode 31. In this case, it is preferable that the moving distance in the direction perpendicular to the lengthwise direction of the anode electrodes 31 is equal to the interval of the target 15 or more, and the entire surface of the substrate 10 opposed to the targets 15.

When the target 15 is sputtered, each magnetic field forming device 25 is reciprocated relative to the target 15.

In FIG. 1, the reference character M denotes a third plane in which the surfaces of the magnetic field forming devices 25 facing the targets 15 are located.

As described above, the magnet holding member 21 moves as It keeps itself parallel to the target attachment plate 11; and therefore, the third plane M is moved parallel to the targets 15.

Therefore, when the surfaces of the magnetic field forming devices 25 are flush with each other, the magnetic field forming devices 25 move while the distance $D_2$ to the backside of the targets 15 is unchanged; and therefore, the movement of the magnetic field forming devices 25 does not change the intensity of leakage magnetic fields at the surface of the targets 15, so that the sputtering (deposition) speed is constant. Note however that the magnetic field intensity in a specified position on the target 15 changes.

When each of the magnetic field forming devices 25 is moved relative to the targets 15 in the range between the anode electrodes 31 positioned on either side of the target 15, the magnetic field forming device 25 is not opposed to the anode electrode 31; and the region to be effectively sputtered by the magnetic field does not include the region of the anode electrode 31.

In the above described sputtering device 1, four targets 15 made of ITO (having a length of 1380 mm, a width of 230 mm, and a thickness of 6 mm) were disposed on a single sputter source 3. Then, DC power of 5.7 kW, 4.6 kW, 4.6 kW, and 5.7 kW were applied to the targets 15, respectively, at a film forming temperature of 200° C. and a film forming pressure of 0.67 Pa, while an argon gas was made to flow at a flow rate of 100 sccm and scanning with the magnetic field forming devices 25 was carried out seven times. As a result, a thin ITO film having a thickness of an estimated 100 nm was formed on the surface of a substrate having a length of 880 mm, a width of 680 mm, and a thickness of 0.7 mm. The distribution of the measured sheet resistance value was in the range of 25±3Ω/square; and it was found that the sheet resistance value varied less than that of the conventional film.

Note that the target attachment plate 11 has a support plate 12 and an insulating, cooling plate 14 provided on one surface of the support plate 12, and the surface of the cooling plate 14 attached to the support plate 12 has a groove. A cooling medium is made to flow in the space defined by the inner circumferential surface of the groove and the support plate 12. The cathode electrode 13 is attached to the cooling plate 14 in a closely contacted state; and therefore, the cathode electrode 13 and the target 15 can be cooled by the cooling medium flowing in the space defined by the inner circumferential surface of the groove and the support plate 12.

Figure 4:
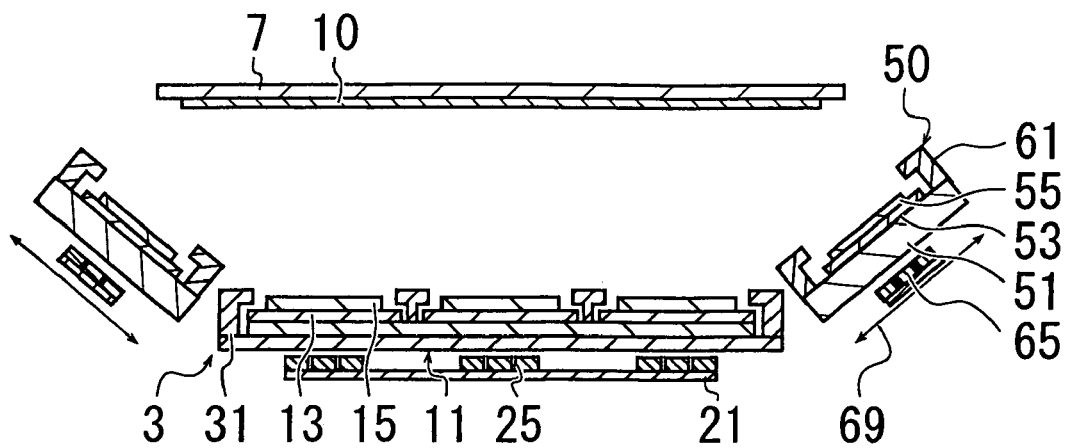
FIG. 4 is a sectional view of a second sputter source.

In the above described example, the surfaces of all the targets 15 are parallel to the substrate 10, while the invention is not limited to such arrangement. In the example shown in FIG. 4, the sputter source 3 as described above is provided between second sputter sources 50 having target 55 positioned obliquely to the surface of the substrate 10. The sputter sources 3 and 50 are provided so that the anode electrodes 31 and 61 are parallel to each other in their longitudinal direction.

Using only the sputter source 3 having the targets 15 whose surfaces are all parallel to the substrate 10, the film thickness on the ends of the substrate 10 tends to be formed thin. The second sputter sources 50 provide an additional amount of sputtered particles that reach the ends of the surface of the substrate 10; and therefore, a film having an equal thickness distribution is formed on the surface of the substrate 10.

In the second sputter source 50, the target 55, an attachment plate 51, the anode electrode 61, and a cathode electrode 53 are reciprocated together so that the surface of the target 55 facing the substrate 10 moves in the same plane. Therefore, the surface of the target 55 moves and is kept slanted at an angle with respect to the substrate 10. The reference numeral 69 in FIG. 4 denotes the direction of reciprocation.

A magnetic field forming device 65 is disposed at the rear surface side of the target 55 for the second sputter source 50, and when the target 55 moves, the magnetic field forming device 65 also reciprocates relative to the target 55. Therefore, a large area of the target 55 can be sputtered.

Figure 5:
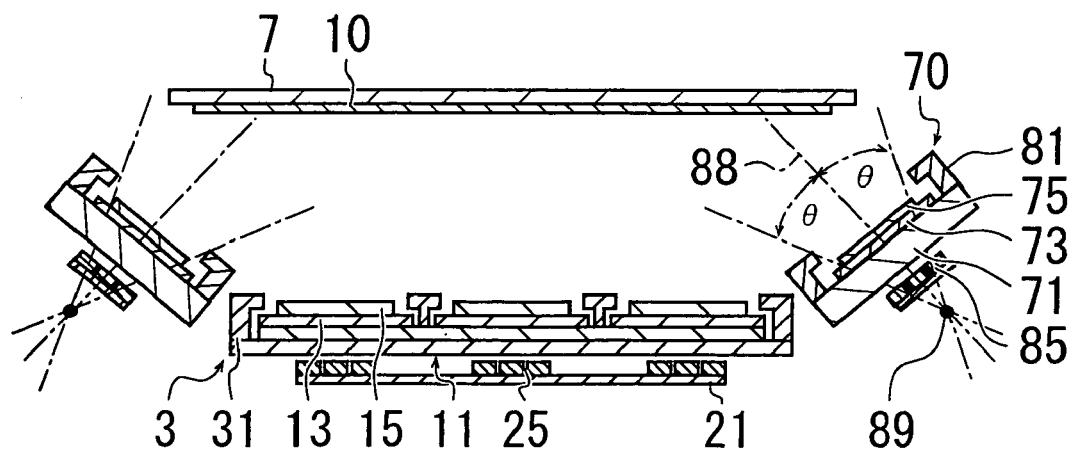
FIG. 5 is a sectional view of a third sputter source.
Figure 6:
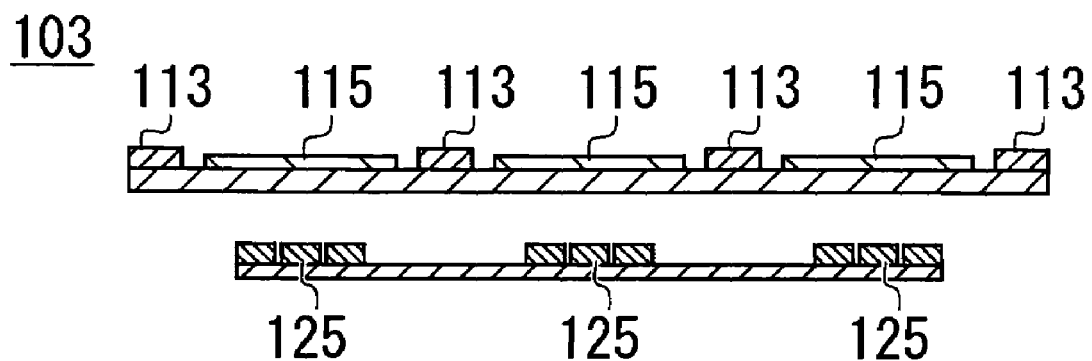
FIG. 6 is a sectional view of a conventional sputter source.
Figure 7:
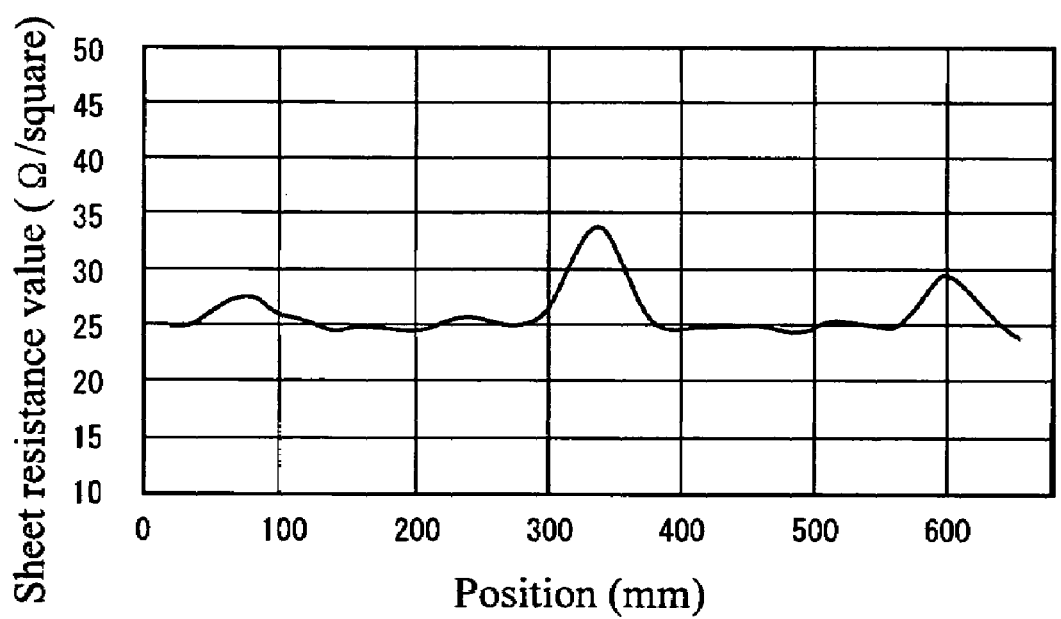
FIG. 7 is a graph representing the thickness distribution of a film formed using a conventional sputter source.

The movement of the target 55 is not limited to the reciprocation. In a third sputter source denoted by the reference numeral 70 in FIG. 5, a target 75 rotates together with an attachment plate 71, an anode electrode 81, and a cathode electrode 73 so that the target 75 moves by ±θ around the point as the center 89 through which the perpendicular 88 to the center of the surface of the target 75 passes.

The above-described sputter source 3 is provided between the two third sputter sources 70, and the sputter sources 3 and 70 are provided so that the anode electrodes 31 and 81 are parallel to each other in their longitudinal direction.

As for the third sputter source 70, a magnetic field forming device 85 can rotate together with the target 75 as it reciprocates parallel to the surface of the target 75; and therefore, a large area of the target 75 is sputtered.

In the above described embodiment, the targets 15 of the sputter source 3 are moved together, but the invention is not limited to this movement and the targets 15 can be fixed to separate attachment plates for separate movement as long as the targets 15 do not collide against each other.

In the above described embodiment, the target 15 is moved at a distance equal to or more than the width A of the anode electrode 31 with respect to the substrate 10. However, if the distance between the anode electrode 31 and the target 15 is too large to ignore, the moving distance of the target 15 in the direction perpendicular to the lengthwise direction of the anode electrode 31 is preferably equal to or more than the interval A' between the targets 15.

In the above embodiment, the substrate 10 is in a stationary state while the sputtering is carried out, but the invention is not limited to such a condition. For example, the present invention also includes the invention whereby the substrate 10 may be rotated within a horizontal plane or both the substrate 10 and targets 15 may be moved together during sputtering.

When both the substrate 10 and the targets 15 are moved together, the magnetic field forming devices 25 consequently move relatively to both the substrate 10 and the targets 15; and therefore, the magnetic field forming devices 25 may be in a stationary state. When the magnetic field forming devices 25 move relatively to the substrate 10 and the targets 15, the magnetic field forming devices 25 may be moved simultaneously with the movement of the substrate 10 and the targets 15.

During sputtering, voltages at different levels may be applied to the respective cathode electrodes 13. For example, when the cathode electrodes 13 near both ends of the substrate 10 are provided with voltage higher than the other cathode electrodes 13, the thickness distribution of the film formed on the substrate 10 can be more homogeneous. In addition, the position, shape, potential or the like of the anode electrodes may be changed as required, so that the film thickness distribution can be adjusted.

The kind of the sputter gas is not limited to argon, but various kinds of gas (such as, a xenon (Xe) gas and a krypton (Kr) gas) may be used. A reactive gas, such as oxygen ($O_2$), may be supplied into the vacuum chamber 2 together with the sputter gas during sputtering. The magnetic field forming device 25 does not have to be made of permanent magnets but may be formed of one or more electromagnets.

According to the invention, the targets move with respect to the substrate during sputtering; and therefore, a uniform film thickness distribution and a homogeneous film quality distribution result for the film formed on the substrate. In addition, the magnetic field forming device is moved relatively to the target during sputtering; and therefore, a large area of the substrate is sputtered. When the magnetic field forming device is also moved relatively to the substrate, the region of the target which is highly sputtered moves with respect to the substrate; and therefore, the film thickness distribution of the film formed on the substrate can be even more homogeneous. The magnetic field forming device is moved between the anode electrodes positioned on either side of the target; and therefore, the anode electrodes are not sputtered.

What is claimed is:

1. A sputter source including a plurality of targets sputtered at a time for providing a film on a substrate, the sputter source comprising:
   a plurality of elongate anode electrodes disposed on a surface of a target attachment plate;
   cathode electrodes each disposed between the anode electrodes, wherein each of the targets is disposed on one of the cathode electrodes; and
   magnetic field forming devices disposed at the rear surface side of the target attachment plate at immediate back of the targets, respectively,
   wherein the anode electrodes and the targets are fixed to the target attachment plate, and the respective magnetic field forming devices and the target attachment plate are capable of moving relatively to each other and the target attachment plate is capable of moving relative to the substrate, wherein the magnetic field forming devices move parallel to the targets, and wherein the magnetic field forming device is moved in a range between the anode electrodes in such a manner that the magnetic field forming device is not located at immediate back of the anode electrode.

2. A sputtering device comprising:

a vacuum chamber;

a holder which is disposed in the vacuum chamber and on which an object to be provided with a film is disposed; and a sputter source disposed in a position opposing the holder in the vacuum chamber, and the sputter source has a plurality of targets, wherein the targets being sputtered together, the sputter source comprising, a plurality of elongate anode electrodes disposed on a surface of a target attachment plate, cathode electrodes disposed between the anode electrodes, respectively, each of the target disposed on one of said cathode electrodes, a magnet holding member disposed at the rear surface side of the target attachment plate, magnetic field forming devices for forming a magnetic field on the surface of each of the target are disposed on the magnet holding member at immediate back of the target, respectively, wherein the target attachment plate and the magnet holding member are connected to a transfer device, wherein the transfer device moves the targets with respect to the holder relatively in a direction parallel to a plane in which the surfaces of the respective targets are located, and the transfer device moves the magnetic field forming devices relatively to the targets, wherein the magnetic field forming devices move parallel to the targets, and wherein the magnetic field forming device is moved in a range between the anode electrodes in such a manner that the magnetic field forming device is not located at immediate back of the anode electrode.

3. The sputtering device according to claim 2, wherein the transfer device moves the magnetic field forming device relatively to the holder.

4. The sputtering device according to claim 3, wherein the transfer device moves the magnetic field forming devices between the anode electrodes positioned on either side of the target so that the magnetic field forming device is not positioned at immediate back of the anode electrode when the magnetic field forming device is moved.

5. The sputtering device according to claim 2, wherein the anode electrodes are provided parallel to each other, and the transfer device reciprocates the respective targets in a direction approximately perpendicular to a lengthwise direction of the anode electrodes.

6. The sputtering device according to claim 5, wherein the transfer device sets a distance of the target moving in a direction perpendicular to the longitudinal direction of the anode electrode to be at least the width of the anode electrode.

7. A sputtering method using a sputter source, the sputter source comprising:

a plurality of elongate anode electrodes provided so as to be approximately flush with each other, cathode electrodes disposed between the anode electrodes, a target disposed on the cathode electrode respectively, and magnetic field forming devices for forming a magnetic field on a surface of the target, disposed at rear surface side of the targets respectively, the sputtering method comprising the steps of:

providing an object to be provided with a film in a position opposing to the surfaces of the targets;

sputtering the targets;

ejecting sputtered particles from the each of target at a time; and forming a film on the object, wherein during the sputtering, each of the targets is moved relatively to the object to be provided with a film while a distance between the plane in which the surfaces of the respective targets are located and the plane in which the surface of the object is located is unchanged, and the magnetic field forming device and each of the targets is moved relatively to each other while a distance between the magnetic field forming device and the rear surface of each of the targets is unchanged, and wherein the magnetic field forming device is moved in a range between the anode electrodes in such a manner that the magnetic field forming device is not located at immediate back of the anode electrode.

8. The sputtering method according to claim 7, wherein the anode electrodes each have a substantially equal width and are parallel to each other, and a component, perpendicular to a lengthwise direction of the anode electrode in moving distance of the target moving relatively to the object to be provided with a film, is larger than the width of the anode electrode.

9. The sputtering method according to claim 7, wherein each the target is moved together with each the anode electrode in the same direction.

10. The sputtering method according to claim 8, wherein the targets are moved together with each of the anode electrodes in the same direction.

11. The sputtering method according to claim 7, wherein the magnetic field forming device and the object to be provided with a film are moved relative to each other.

* * * * *